Figure 1A:
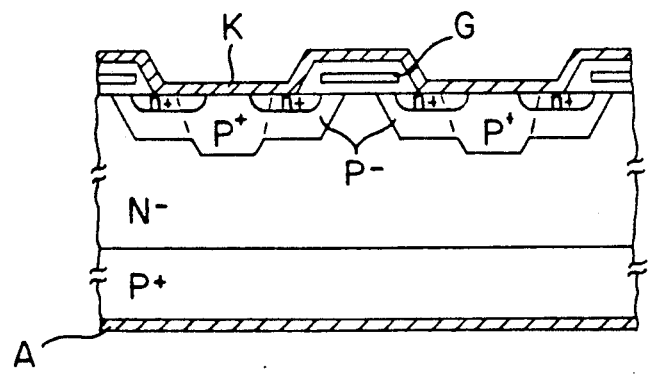

United States Patent [19]

Musumeci et al.

[11] Patent Number: 5,073,511
[45] Date of Patent: Dec. 17, 1991

[54] METHOD FOR MANUFACTURING A CONDUCTIVITY MODULATION MOS SEMICONDUCTOR POWER DEVICE (HIMOS)

[75] Inventors: Salvatore Musumeci, Riposto; Cesare Ronsisvalle, Catania, both of Italy

[73] Assignee: SGS-Thomson Microelectronics S.r.L., Milan, Italy

[21] Appl. No.: 330,182

[22] Filed: Mar. 29, 1989

[30]   Foreign Application Priority Data

Mar. 29, 1988 [IT]   Italy .............................. 20005 A/88

[51] Int. Cl.$^5$ .......................................... H01L 21/336
[52] U.S. Cl. ...................................... 437/40; 437/29; 437/81; 437/95; 148/DIG. 26
[58] Field of Search ...................... 357/23.4; 437/6, 27, 437/29, 26, 40, 41, 228, 150; 148/33.5, 81, 95

[56]         References Cited

U.S. PATENT DOCUMENTS 4,364,073  12/1982  Becke et al. ........................ 357/234
4,696,701  9/1987  Sullivan ............................. 148/33.5

FOREIGN PATENT DOCUMENTS 0109331  5/1984  France .
60-260152  12/1985  Japan .

OTHER PUBLICATIONS

Di-Son Kuo, "Optimization of Epitaxial Layers for Power Bipolar-MOS Transistor" IEEE Elect. Devices Letters, Sep. 1986, pp. 510-512.
Toaliga et al., "The Insulated Gate Transistor: a New Three Terminal Mos-Controlled Bipolar Device" IEEE Trans. on Elec. Devices, Jun. 84, pp. 821-827.
Hefner et al., "Performance Trade-Off . . . ", I.E.E.E. Transactions on Power Electronics, PE-2 (1987) Jul., No. 3, pp. 194-207.
Russell et al., "HIgh-Power Conductivity-Modulated . . . ", 8179 IEEE Electron Device Letters, EDL-5 (1984) Nov., No. 11, pp. 437-439.

Primary Examiner—Brian E. Hearn
Assistant Examiner—Tom Thomas
Attorney, Agent, or Firm—Birch, Stewart, Kolasch & Birch

[57]              ABSTRACT

The thin buffer layer, very often present in HIMOS devices, is achieved by ion implantation or predeposition of the dopant followed by subsequent diffusion.

4 Claims, 3 Drawing Sheets

METHOD FOR MANUFACTURING A CONDUCTIVITY MODULATION MOS SEMICONDUCTOR POWER DEVICE (HIMOS)

This invention relates to a method for manufacturing a conductivity modulation MOS power device (HIMOS device). In HIMOS transistors, the limitation of the conventional type MOS power devices, deriving from the high resistance of the drain epitaxial region, are overcome by modulating the conductivity of the drain region by injecting minority carriers of a junction (P-N or N-P depending on whether it is an N-channel or a P-channel HIMOS) in series with the drain.

In order to make it less probable that the intrinsic parasitic thyristor of the structure itself be activated, a thin (N+ type or P+ type, respectively) epitaxial buffer layer is often provided between the substrate (P+ or N+) and the epitaxial layer (N− or P−) constituting the aforesaid junction, so as to increase the amount of charge of the aforesaid epitaxial layer (N− P−).

It is not possible, however, with epitaxial technique to create the buffer layer with concentration of dopant higher than $10^{16}$ atoms/cm$^3$; and this greatly limits the efficiency of the aforesaid buffer layer.

The invention makes it possible to create a buffer layer with considerably higher concentrations of dopant than those which can be obtained by epitaxial growth, with the dual effect of protecting the device from the possibility of the parasitic thyristor being activated and of considerably reducing the HIMOS transistor turn-off time.

The manufacturing method according to the invention comprises, for the purpose of creating the aforesaid buffer layer, the following phases:

epitaxial growth, on the aforesaid substrate, of a thin semiconductor layer of the same type of conductivity as the substrate itself; and ion implantation or deposition, in the aforesaid thin layer, of dopant of the type (N or P) required for creating the buffer layer, followed by subsequent diffusion.

Figure 1B:
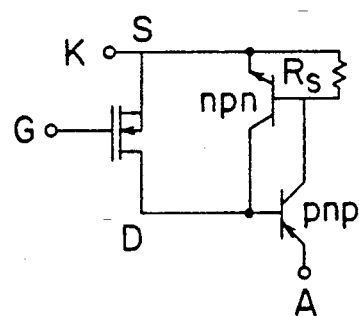
Figure 2:
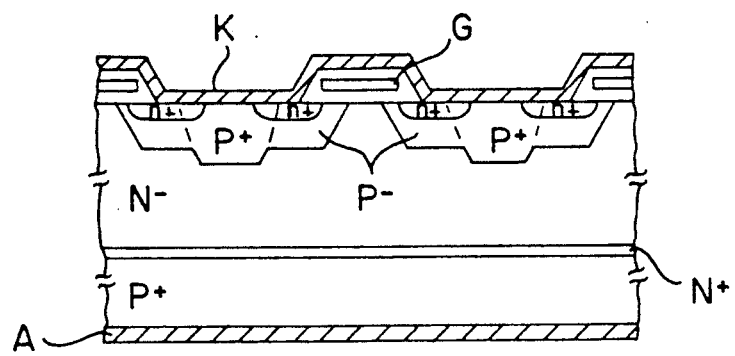
Figure 3A:
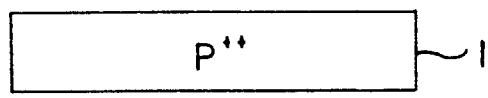
Figure 3B:
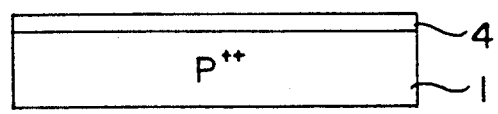
Figure 3C:
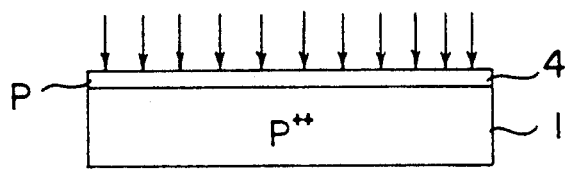
Figure 3D:
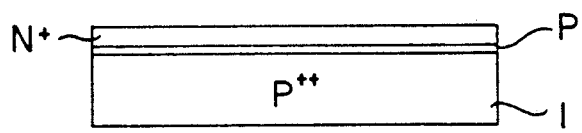
Figure 3E:
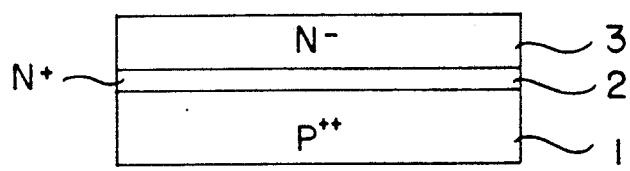
Figure 3F:
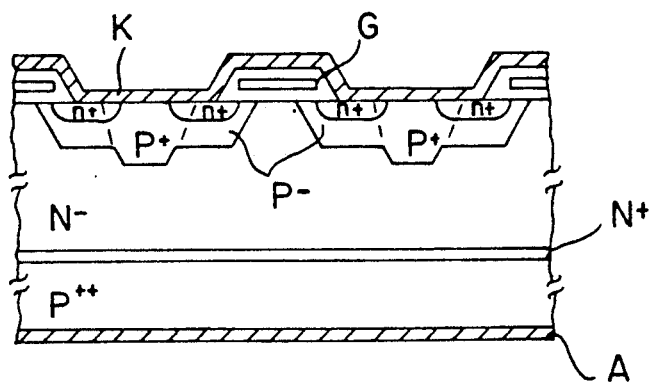
Figure 4A:
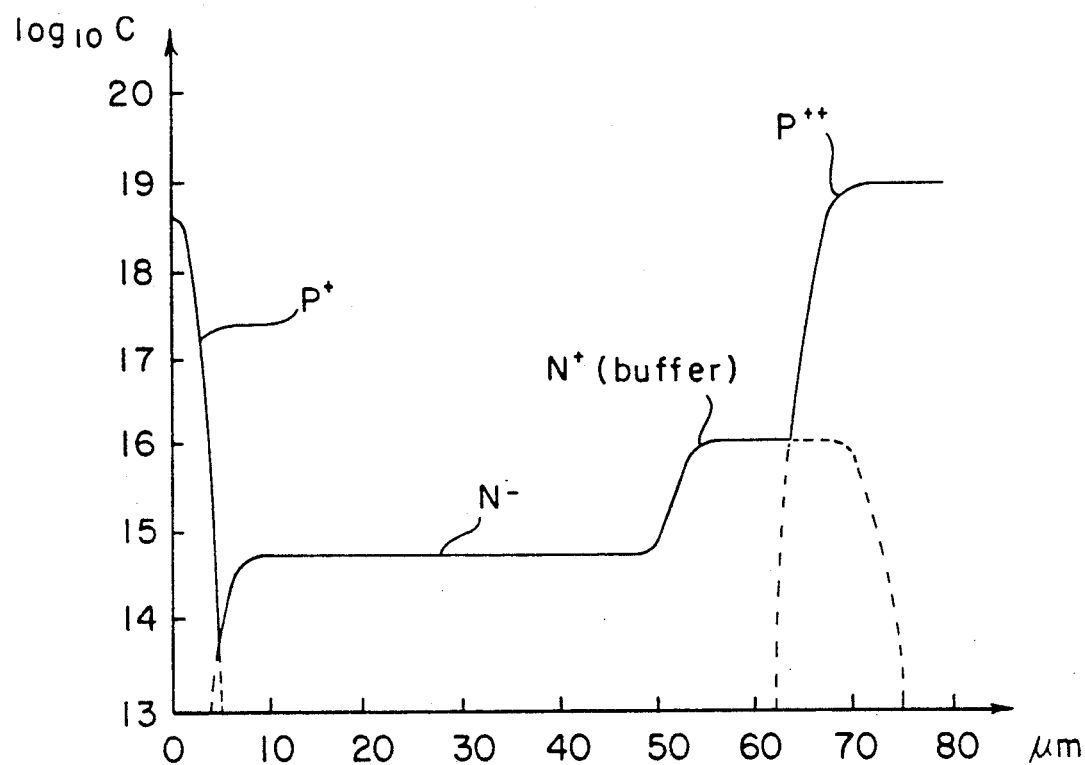
Figure 4B:
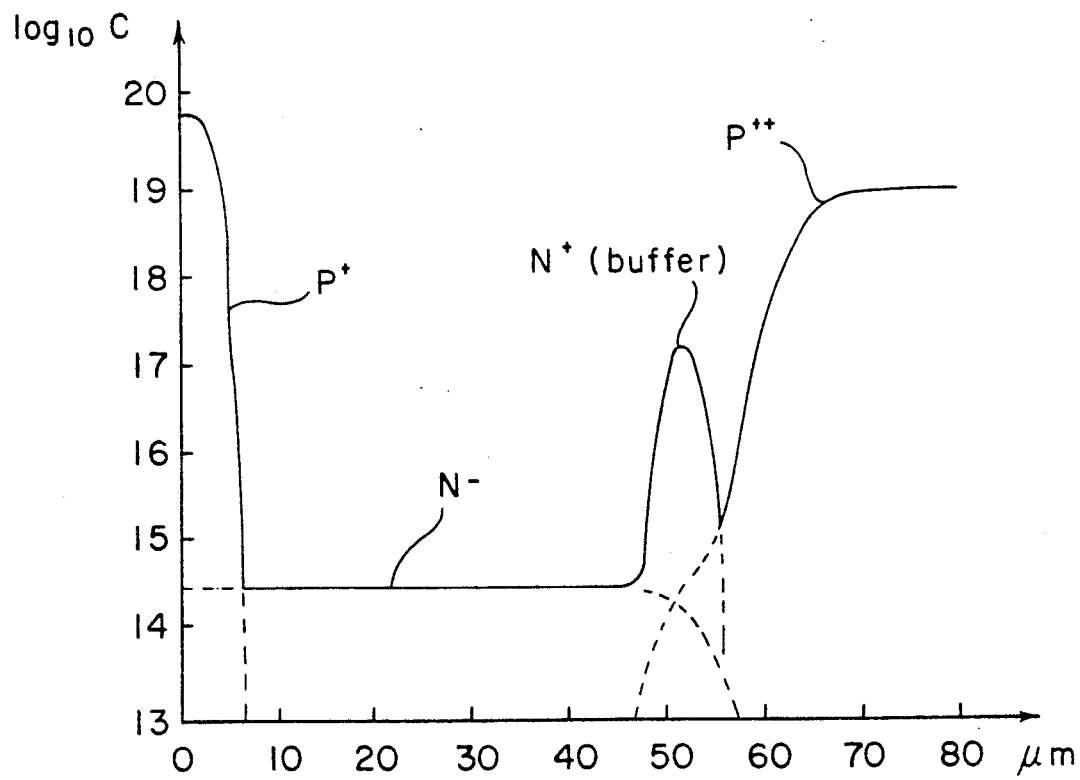

The features of the invention will be more clearly evident from the following description and accompanying drawings of a non-restrictive embodiment in which:

FIG. 1a: shows the structure of a conventional type HIMOS power transistor;

FIG. 1b: shows the equivalent circuit of the structure of FIG. 1a;

FIG. 2: shows the structure of a HIMOS transistor with an epitaxial buffer layer;

FIGS. 3a-3e: show a schematic representation of a structure according to the invention, during the various phases of the manufacturing process;

FIG. 3f: shows the structure of a HIMOS transistor at the end of the manufacturing process according to the invention;

FIGS. 4a and 4b: show curves illustrating the concentrations of dopant in the buffer layer that can be obtained, respectively, with the conventional method and with the method according to the invention.

FIG. 1a shows the structure of a conventional type N-channel HIMOS power transistor. According to this structure, the conductivity of the drain region is modulated by injecting minority carriers in the P-N junction, in series with the drain, consisting of the substrate P+ and the overlying epitaxial layer N−.

FIG. 1b shows the equivalent circuit of the structure of FIG. 1a and, particular, the intrinsic parasitic thyristor of the structure itself. The parasitic thyristor is activated whenever the sum of the common-based current gains $\alpha_n + \alpha_p$ of the two transistors npn and pnp (with $\alpha_n = \alpha_{npn}$ and $= \alpha_{pnp}$) reaches value 1. Consequently to avoid activating the parasitic thyristor it must be $(\alpha_n + \alpha_p) < 1$. In practice, it is necessary to ensure that this condition is complied with by reducing the $\alpha_p$ value as much as possible. Since the current gain $\alpha$ is a function both of the thickness and of the concentration of basic dopant (in the sense that when each of these magnitudes is increased the gain decreases), one of the most widely used solutions is that of adding a thin epitaxial layer ("buffer") N+ between the substrate P+ and the epitaxial layer N− (as shown in the sturcture of FIG. 2), so as to increase the amount of charge in the epitaxial region N− which is the base of the transistor pnp (in FIG. 2 the base of the transistor pnp consists of the epitaxial buffer layer N+ together with the epitaxial layer N−) thus obtaining a considerable reduction of $\alpha p$.

The lowering of $\alpha p$, equivalent to a decrease in the amount of minority charges (holes) injected from the substrate P+ and stored in the region N− during the conduction phase, also involves a considerable reduction in the turn-off times of the devices shown in FIG. 2 due to the smaller quantity of holes to be recombined.

The known technique of creating the structure of FIG. 2 is that of sequentially growing the buffer layer N+ and the overlying region N− on the substrate P+ by the epitaxial technique and then proceeding to manufacture the device.

It is not possible, however, with the epitaxial technique to create the buffer layer with a concentration of more than $10^{16}$ atoms/cm$^3$, either for N-type or for P-type dopants. This shows the limited efficiency of this solution. On the contrary, with the solution proposed by the invention it is possible to create a buffer layer with a much higher concentration of dopant than is possible with epitaxial growth, thus obtaining a more drastic reduction both of $\alpha_p$ and of turn-off times of the device.

The technique used for creating the buffer layer according to the invention is illustrated by the example shown in FIGS. 3a-3e, which schematically represent the structure of a device during the various phases of its manufacturing process.

The process starts with a substrate 1 of silicon P++(100) having a resistivity of 15-20 mohm.cm (FIG. 3a), on which is epitaxially grown a thin layer 4 of approximately 15 μm of P-type silicon (boron doped) having a resistivity of 25 ohm.cm (FIG. 3b).

A dose of $5 \cdot 10^{14}$ atoms/cm$^2$ of antimony is implanted on this epitaxial layer (FIG. 3c) and then the dopant Sb is diffused at a temperature T=1150° C. for two hours in order to form the layer N+ smaller in thickness than the first epitaxial layer grown (FIG. 3d).

At this point the second epitaxial growth of the N-type layer 3 is carried out, with resistivity and thickness determined by the voltage $BV_{DSS}$ of the device to be produced (FIG. 3e). In the manufacturing sequence (passage from FIG. 3d to FIG. 3e) the residual P-type thin layer (not essential for the purposes of the invention) is completely absorbed by the out-diffusion of the boron of the substrate, with consequent complete formation of the buffer layer 2.

Once the N-type layer 3 has been formed, the manufacturing ring process is exactly the same as that of any other MOS power device. The structure of the finshed device is as shown in FIG. 3f.

It should be pointed out that the first epitaxial layer P (grown directly on the substrate P++) serves the purpose of buffering the out-diffusion of the boron of the substrate, since if the implantation were to be carried out directly on the substrate P++, during the subsequent high temperature thermal processes the boron in the substrate would spread towards the epitaxial layer and cause the buffer N+ to disappear, because the concentration of boron would exceed the concentration of antimony.

FIGS. 4a and 4b refer, respectively, to a HIMOS device produced according to the known technique and a similar device produced according to the invention, and enable a comparsion to be made between the doping obtainable with the conventional process and with the process according to the invention. They show the considerable increase in the concentration of dopant in the "buffer" layer made possible by the latter process.

According to a further embodiment of the invention, the first epitaxial growth P on the substrate of P++ (FIG. 3b) is followed by the predeposition, instead of implantation, of the dopant antimony and the subsequent diffusion of the latter, reobtaining the structure of FIG. 3d; the rest of the process remains uncharged.

It is, of course, possible to use arsenic or phosphorus in place of antimony, both in the ion implantation and in the predeposition.

It is also obvious that the previously described process can also be used for P-channel HIMOS devices, starting from a substrate N and reversing the type of conductivity of all the susequent regions of FIG. 3.

With respect to the conventional process of FIG. 2, the process according to the previously described invention not only offers the advantages of greater safety against the danger of activating the parasitic thyristor and of reducing the tune-off times, but also the following advantages:

the first epitaxial layer grown on the structure P++ is of the P type (FIG. 3b) and not of N type, thus preventing the occurrence of autodoping (consisting in evaporation of the dopant of the substrate with consequent undesirable incorporation in the epitaxial layer);

The quantity of dopant in the layer N+ (buffer is more easily controlled with the ion implantation technique rather than with that of epitaxial growth, which has a dispersion of 8% both on the resistivity and on the thickness, resulting in a more precise optimization of the layer N+.

We claim:

1. A method for manufacturing a P-channel conductivity modulation MOS semiconductor power device in which the conductivity of the drain region is modulated by the injection of minority carriers of an N-P junction in series with the drain, said junction comprising an N+ type semicondutor substrate over which lies in sequence an P+ type thin buffer and an P− type epitaxial layer, wherein the formation of said buffer layer comprises the following steps in sequence:
   epitaxially growing a thin N type semiconductor layer on said semiconductor substrate;
   ion implanting or depositing P type dopant in said thin semiconductor layer;
   diffusing said dopant at a sufficient temperature and for a sufficient length of time of form a P+ layer; and
   epitaxially growing said P− type epitaxial layer.

2. A manufacturing method as claimed im claim 1, wherein the temperature and the time at which said diffusion of the dopant in the thin semiconductor layer occurs are controlled so that the thickness of the resulting P+ layer is smaller than the original thickness of the thin layer.

3. A method for manufacturing an N-channel or P-channel conductivity modulation MOS semiconductor power device in which the conductivity of the drain region is modulated by the injection of minority carriers of a P-N or N-P junction in series with the drain, said junction comprising a P+ type or N+ type semiconductor substate over which lies sequence an N+ type or P+ type thin buffer layer and N− type or P− type epitaxial layer wherein the formation of said buffer layer comprises the following steps in sequence:
   epitaxially growing a thin P type or N type semiconductor layer on said semiconductor substrate;
   ion implanting or depositing N type or P type dopant in said thin semiconductor layer;
   diffusing said dopant at a sufficient temperature and for a sufficient length of time to form a N+ or P+ layer; and
   epitaxially growing said N− type or P− type epitaxial layer.

4. A manufacturing method as claimed in claim 3, wherein the temperature and the time at which said diffusion of the dopant in the thin semiconductor layer occurs are controlled so that the thickness of the resulting N+ or P+ layer is smaller than the original thickness of the thin layer.

* * * * *